US010878893B1

(12) United States Patent
Choserot et al.

(10) Patent No.: US 10,878,893 B1
(45) Date of Patent: Dec. 29, 2020

(54) CONTROL ARCHITECTURE FOR COLUMN DECODER CIRCUITRY

(71) Applicant: Arm Limited, Cambridge (GB)

(72) Inventors: Vianney Antoine Choserot, Antibes (FR); Andy Wangkun Chen, Austin, TX (US); Sriram Thyagarajan, Austin, TX (US); Yew Keong Chong, Austin, TX (US); Munish Kumar, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/431,716

(22) Filed: Jun. 4, 2019

(51) Int. Cl.
*G11C 11/419* (2006.01)
*G11C 11/418* (2006.01)
*H01L 27/11* (2006.01)
*G11C 11/56* (2006.01)
*G11C 11/412* (2006.01)

(52) U.S. Cl.
CPC .......... *G11C 11/419* (2013.01); *G11C 11/412* (2013.01); *G11C 11/418* (2013.01); *G11C 11/56* (2013.01); *H01L 27/1104* (2013.01)

(58) Field of Classification Search
CPC ....... G11C 8/10; G11C 11/419; G11C 11/412; G11C 11/418; G11C 11/56; G11C 16/08; H01L 2924/00; H01L 27/1104
See application file for complete search history.

(56) References Cited

U.S. PATENT DOCUMENTS

| 6,122,197 A * | 9/2000 | Sinai | G11C 16/10 365/154 |
| 6,292,401 B1* | 9/2001 | Zhang | G11C 7/18 365/189.02 |
| 7,477,551 B2* | 1/2009 | Avramescu | G11C 7/1048 365/189.02 |
| 8,804,437 B2* | 8/2014 | Gotterba | G11C 11/419 365/189.02 |
| 9,887,011 B1* | 2/2018 | Hung | G11C 16/10 |

* cited by examiner

*Primary Examiner* — Ajay Ojha
(74) *Attorney, Agent, or Firm* — Pramudji Law Group PLLC; Ari Pramudji

(57) ABSTRACT

Various implementations described herein are directed to memory circuitry having an array of bitcells and bitlines coupled to columns of the bitcells. Also, column decoder circuitry may be coupled to the bitcells via the bitlines, and the column decoder circuitry may have read logic coupled to an output node. The column decoder circuitry may have select logic coupled between a voltage supply and the read logic. Enable signals may be used to activate the select logic to pass the voltage supply to the read logic, and the bitlines provide bitline signals that activate the read logic to pass the voltage supply from the select logic to the output node.

23 Claims, 4 Drawing Sheets

CONTROL ARCHITECTURE FOR COLUMN DECODER CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern conventional designs, multiplexing circuitry and full-swing sensing is typically achieved in two different steps. This configuration can lead to timing delay for both functions. This configuration can also lead to inefficiencies in area usage. As such, various improvements in physical design of some circuit layouts is desirable to improve timing characteristics and efficient usage of area in modern memory designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to control architecture for implementing column decoding schemes and techniques. In some instances, various implementations described herein are directed to high-speed column multiplexer circuitry for multi-port static random access memory (SRAM) with full-swing bitlines. Also, various implementations described herein refer to combining multiple functions (e.g., multiplexing of read bitlines and full-swing sensing) in a single circuit that may improve read speed and area. As will be described herein below, various implementations described herein may provide for merging multiple circuit functions into a single transistor function. Also, this merging may provide for less timing delay and a denser floorplan.

Various implementations of column decoding schemes and techniques will now be described in greater detail herein with reference to FIGS. 1-3.

Figure 1:
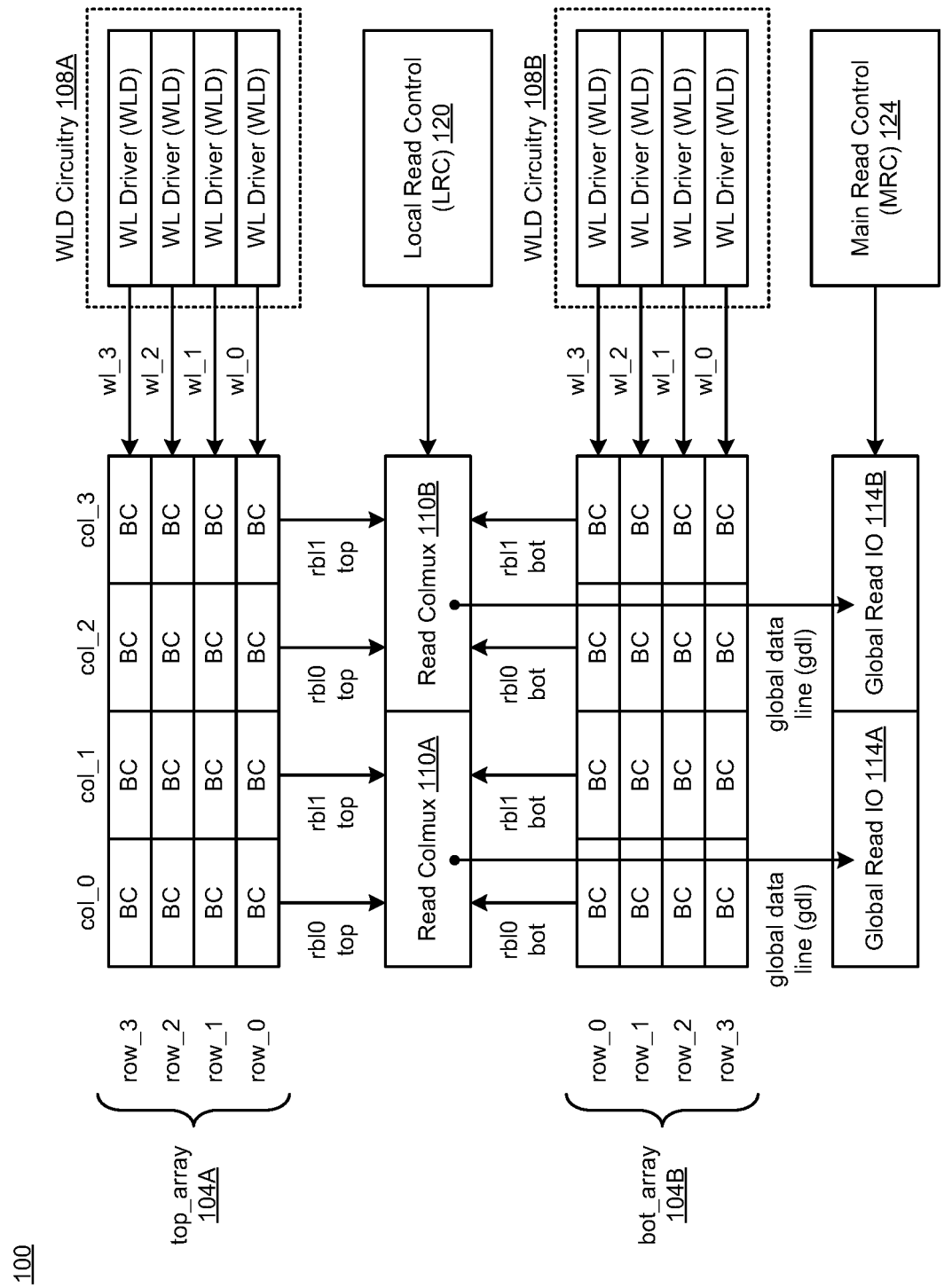
FIG. 1 illustrates a diagram of memory circuitry in accordance with various implementations described herein.

FIG. 1 illustrates a diagram of memory or memory circuitry 100 in accordance with implementations described herein. In some instances, the memory circuitry 100 may be implemented as a system of various circuit components that are arranged and coupled together as an assemblage or combination of parts that form a memory structure. Also, in some instances, a method of high-speed column decoding may involve use of various circuit components described herein to implement improved performance techniques.

The memory circuitry 100 may include multiple arrays 104A, 104B of bitcells (BC) and bitlines (rbl) coupled to columns (col) of the bitcells (BC). In some instances, the memory circuitry 100 may include multi-port memory, such as, e.g., multi-port static random access memory (SRAM). In some implementations, the multiple arrays 104A, 104B of bitcells (BC) may include a first array 104A of bitcells (BC) and a second array 104B of bitcells (BC). The first array 104A may be referred to as an upper (or top) array, and the second array 104B may be referred to as a lower (or bottom) array. The bitlines (rbl) may be referred to as read bitlines (rbl), such as, e.g., full-swing read bitlines. Also, the bitlines (rbl) may include first bitlines (rbl0_top, rbl1_top), and bitlines (rbl) may include second bitlines (rbl0_bot, rbl1_bot).

In some implementations, the first array 104A (top_array) may have multiple bitcells (BC) arranged in multiple columns (col_0, col_1, col_2, col_3) and multiple rows (row_0, row_1, row_2, row_3). The second array 104A (top_array) may have multiple bitcells (BC) arranged in multiple columns (col_0, col_1, col_2, col_3) and multiple rows (row_0, row_1, row_2, row_3). Also, in some implementations, the memory circuitry 100 may include wordlines (wl_0, wl_1, wl_2, wl_3) that are coupled to the rows (row_0, row_1, row_2, row_3) of the bitcells (BC), and the memory circuitry 100 may include wordline driver circuitry (108A, 108B) having wordline drivers (WLD) coupled to the corresponding bitcells (BC) via the wordlines (wl_0, wl_1, wl_2, wl_3).

As shown in FIG. 1, the first and second arrays 104A, 104B may include any number of bitcells (BC) that are arranged in various configurations, such as, e.g., a two-dimensional (2D) memory array having any number (N) of columns and any number of rows of multiple bitcells (BC). In general, each bitcell (BC) may be referred to as a data-bitcell (or memory storage cell), and each bitcell (BC) may be configured to store at least one data bit value (e.g., data value associated with logical '0' or '1'). The first and second arrays 104A, 104B may be referred to as a data-bitcell array. Also, the bitcells of the first and second arrays 114A, 104B may be implemented with static random access memory (SRAM) circuitry, and each bitcell (BC) may include a multi-transistor SRAM cell, including various types of SRAM cells, such as, e.g., 6T CMOS SRAM and/or other types of CMOS SRAM cells, such as, e.g., 4T, 8T, 10T or more transistors per bit. However, various other types of memory may be used.

The memory circuitry 100 may include column decoder circuitry 110A, 110B coupled to corresponding bitcells (BC) via the bitlines (rbl). The column decoder circuitry 110A, 110B may be referred to as read column multiplexer (colmux) circuitry. As shown, the column decoder circuitry 110A, 110B may include a first column multiplexer (colmux) 110A and a second column multiplexer (colmux) 110B. Also, the column decoder circuitry 110A, 110B may provide read output signals, such as, e.g., global data line (GDL) signals, to global read column input/output (IO) circuitry 114A, 114B.

In some implementations, the first column multiplexer (colmux) 110A may be coupled to columns (col_0, col_1) of bitcells (BC) in the first or top_array 104A via the first bitlines (rbl0_top, rbl1_top), and the second column multiplexer (colmux) 110B may be coupled to columns (col_2, col_3) of bitcells (BC) in the first or top_array 104A via the first bitlines (rbl0_top, rbl1_top). In addition, the first column multiplexer (colmux) 110A may be coupled to columns (col_0, col_1) of bitcells (BC) in the second or bot_array 104B via the second bitlines (rbl0_bot, rbl1_bot), and the second column multiplexer (colmux) 110B may be coupled to columns (col_2, col_3) of bitcells (BC) in the second or bot_array 104B via the second bitlines (rbl0_bot, rbl1_bot).

In some instances, the first column multiplexer (colmux) 110A may provide a first read output signal (e.g., a first global data line (GDL) signal) to a first global read column input/output (IO) circuit 114A. Also, the second column multiplexer (colmux) 110B may provide a second read output signal (e.g., a second global data line (GDL) signal) to a second global read column input/output (IO) circuit 114B.

The memory circuitry 100 may include local read control 120 that is coupled to the read column decoder circuitry 104A, 104B. The memory circuitry 100 may include main read control 124 that is coupled to the global read column input/output (IO) circuitry 114A, 114B. As shown, the first column multiplexer (colmux) 110A may include a read column multiplexer (read colmux) that is configured to provide the first global data line (GDL) signal to a first global read IO 114A, and the second column multiplexer (colmux) 110B may include a read column multiplexer (read colmux) that is configured to provide the second global data line (GDL) signal to a second global read IO 114B.

Figure 2A:
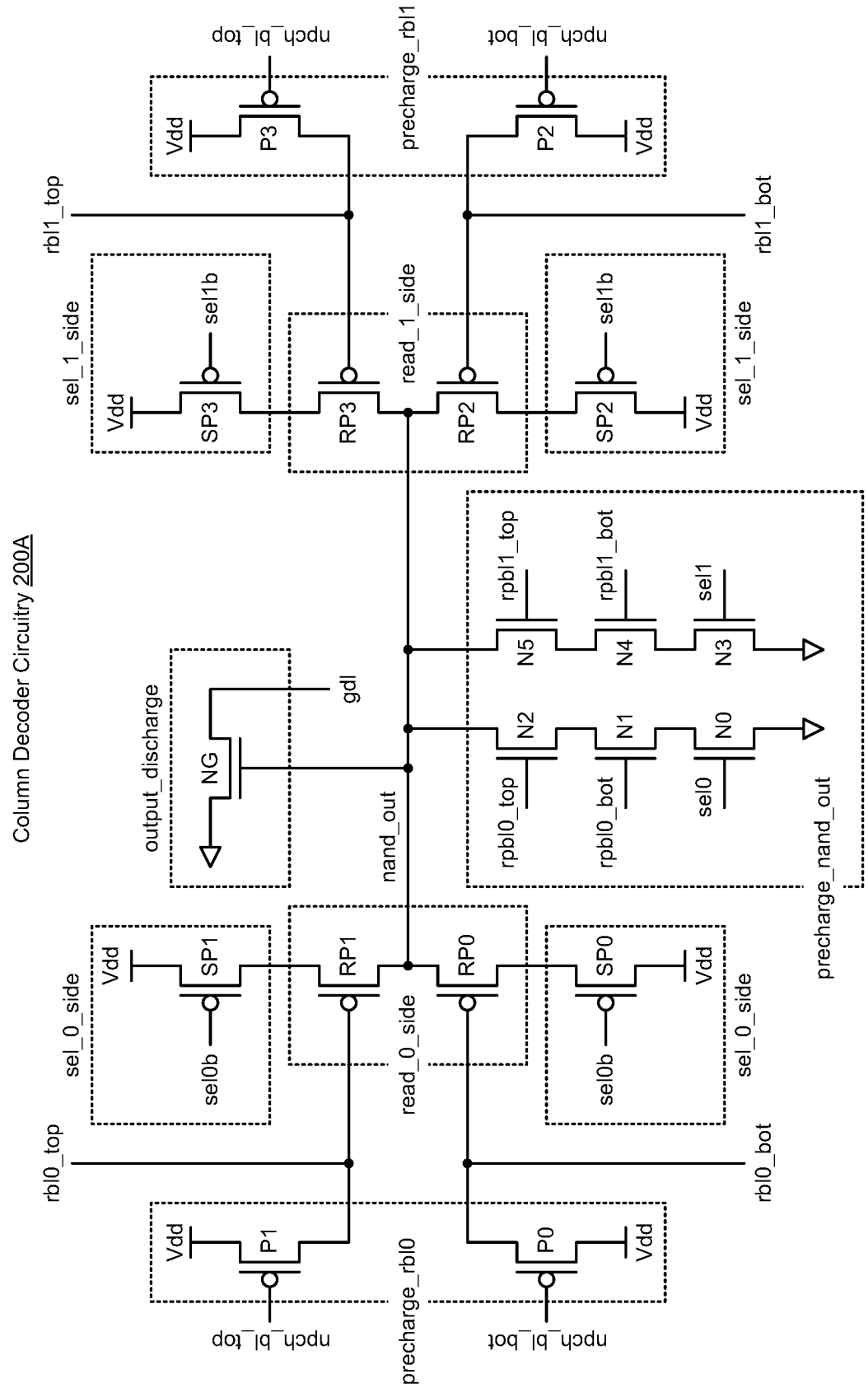
FIGS. 2A-2B illustrate diagrams of column decoder circuitry in accordance with various implementations described herein.
Figure 2B:
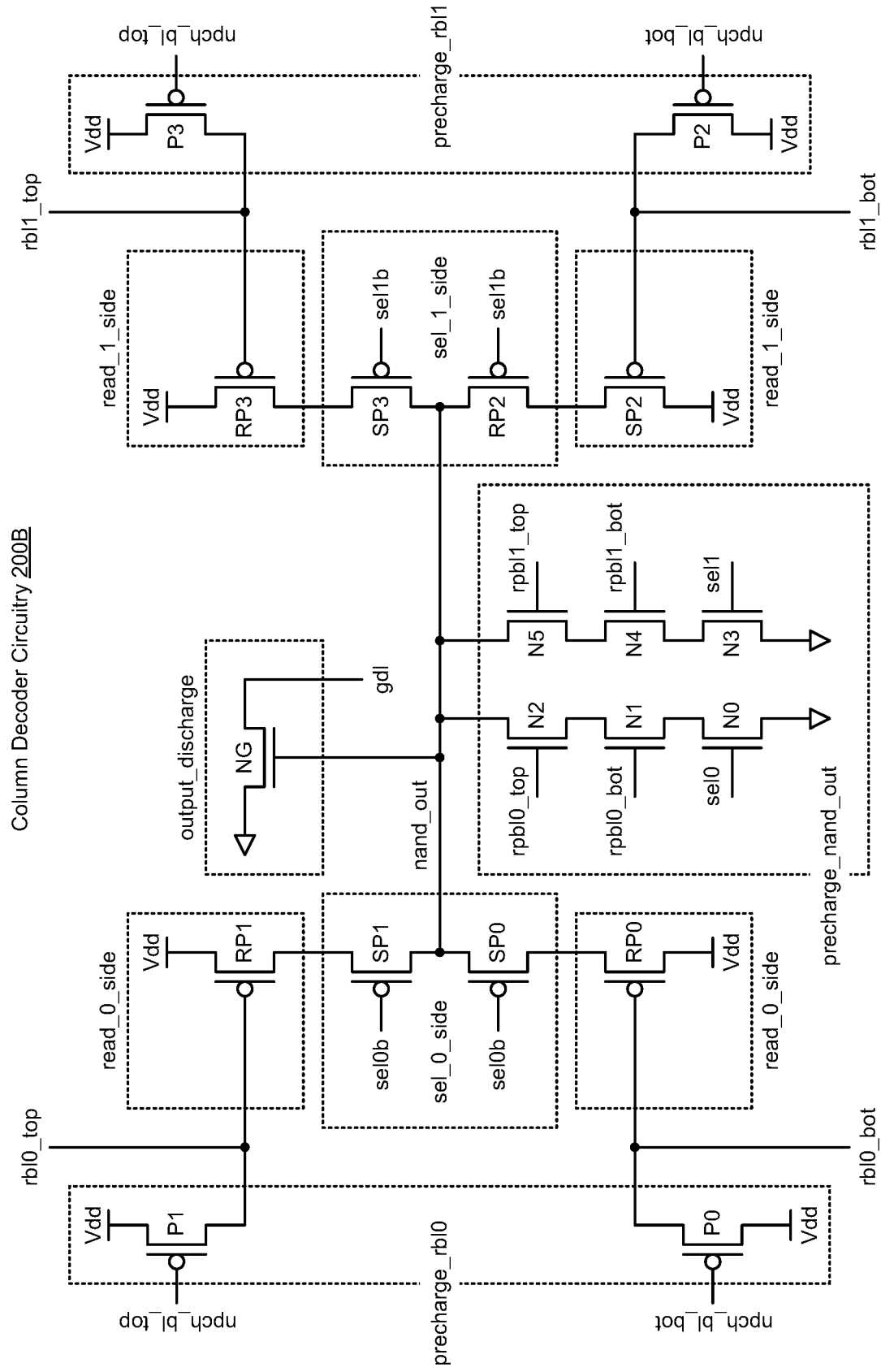

FIGS. 2A-2B illustrate various diagrams of column decoder circuitry 200A, 200B in accordance with various implementations described herein. In particular, FIG. 2A shows an implementation of column decoder circuitry 200A, and FIG. 2B shows another implementation of column decoder circuitry 200B.

FIG. 2A illustrates a diagram of column decoder circuitry 200A in accordance with various implementations described herein. The column decoder circuitry 200A may be implemented as the column multiplexers (colmux) 110A, 110B in FIG. 1. In various implementations, the column decoder circuitry 200A may include complementary metal-oxide-semiconductor (CMOS) devices, including, e.g., P-type MOS (PMOS) devices and N-type MOS (NMOS) devices.

As shown in FIG. 2A, the column decoder circuitry 200A may be coupled to the bitlines (rbl0_top, rbl1_top, rbl0_bot, rbl1_bot). Also, the bitlines (rbl0_top, rbl1_top, rbl0_bot, rbl1_bot) may be referred to as read bitlines, and the bitlines (rbl0_top, rbl1_top, rbl0_bot, rbl1_bot) may be coupled to read logic (read_0_side, read_1_side).

The column decoder circuitry 200A may include the read logic (read_0_side, read_1_side) that is coupled to an output node (nand_out). The read logic (read_0_side, read_1_side) may include read transistors (RP0, RP1, RP2, RP3). In some instances, the read transistors (RP0, RP1, RP2, RP3) may include PMOS transistors. However, in other instances, the read transistors (RP0, RP1, RP2, RP3) may include use of NMOS transistors.

The column decoder circuitry 200A may include select logic (sel_0_side, sel_1_side) coupled between a voltage supply (Vdd) and the read logic (read_0_side, read_1_side). The select logic (sel_0_side, sel_1_side) may include select transistors (SP0, SP1, SP2, SP3). In some instances, the select transistors (SP0, SP1, SP2, SP3) may include PMOS transistors. However, in other instances, the read transistors may include use of NMOS transistors.

In some instances, enable signals (sel0b, sel1b) may be used to activate the select logic (sel_0_side, sel_1_side) to pass the voltage supply (Vdd) to the read logic (read_0_side, read_1_side). Also, the bitlines (rbl0_top, rbl1_top, rbl0_bot, rbl1_bot) may provide bitline signals that activate the read logic (read_0_side, read_1_side) to pass the voltage supply (Vdd) from the select logic (sel_0_side, sel_1_side) to the output node (nand_out).

The select logic (sel_0_side, sel_1_side) may include use of select transistors (SP0, SP1, SP2, SP3), and the enable signals (sel0b, sel1b) may be referred to as select activation signals. The select activation signals (sel0b, sel1b) may be used to activate gates of the select transistors (SP0, SP1, SP2, SP3) so as to pass the voltage supply (Vdd) to the read logic (read_0_side, read_1_side).

The read logic (read_0_side, read_1_side) may include use of read transistors (RP0, RP1, RP2, RP3), and the bitlines (rbl0_top, rbl1_top, rbl0_bot, rbl1_bot) may be coupled to gates of the read transistors. Also, the bitlines (rbl0_top, rbl1_top, rbl0_bot, rbl1_bot) may provide the bitline signals to activate gates of the read transistors (RP0, RP1, RP2, RP3) so as to pass the voltage supply (Vdd) from the select logic (sel_0_side, sel_1_side) to the output node (nand_out).

The column decoder circuitry 200A may include precharge logic (precharge rbl0, precharge rbl1) coupled between the voltage supply (Vdd) and the read logic (read_0_side, read_1_side). In some implementations, precharge activation signals (npch_bl_top, npch_bl_bot) may be used to activate the precharge logic (precharge rbl0, precharge rbl1) so as to pass the voltage supply (Vdd) to the read logic (read_0_side, read_1_side). The voltage supply (Vdd) may be used to precharge the bitlines (rbl0_top, rbl1_top, rbl0_bot, rbl1_bot) with the read logic (read_0_side, read_1_side).

The precharge logic (precharge rbl0, precharge rbl1) may include precharge transistors (P0, P1, P2, P3) that are coupled between the voltage supply (Vdd) and gates of the read transistors (RP0, RP1, RP2, RP3). Also, the precharge activation signals (npch_bl_top, npch_bl_bot) may be used to activate gates of the precharge transistors (P0, P1, P2, P3) so as to pass the voltage supply (Vdd) to the gates of the read transistors (RP0, RP1, RP2, RP3). The voltage supply (Vdd) may be used to precharge the bitlines (rbl0_top, rbl1_top, rbl0_bot, rbl1_bot) at the gates of the read transistors (RP0, RP1, RP2, RP3). In some instances, the precharge transistors (P0, P1, P2, P3) may include PMOS transistors. However, in other instances, the read transistors may include use of NMOS transistors.

The column decoder circuitry 200A may include output discharge logic (output_discharge) that is coupled to the output node (nand_out). Also, the read logic (read_0_side, read_1_side) may be used to pass the voltage supply (Vdd) to the output node (nand_out) to activate the output discharge logic (output_discharge). The output discharge logic (output_discharge) may be used to pass an output discharge signal to ground (Gnd or Vss). The output discharge logic (output_discharge) may include an output discharge transistor (NG), and the output node (nand_out) may be coupled to a gate of the output discharge transistor (NG). The read transistors (RP0, RP1, RP2, RP3) may be used to pass the voltage supply (Vdd) to the output node (nand_out) to activate the gate of the output discharge transistor (NG), and when activated, the output discharge transistor (NG) may be used to pass the output discharge signal to ground (Gnd or Vss). In some instances, the output discharge signal may include use of a global data line (GDL) signal. In some instances, the output discharge transistor (NG) may include an NMOS transistor. However, in other instances, the output discharge transistor (NG) may include use of a PMOS transistor.

The column decoder circuitry 200A may include output circuitry (precharge_nand_out) having multiple transistors (N0, N1, N2, N3, N4, N5) that are coupled together in series and arranged in one or more stacks between the output node (nand_out) and ground (Gnd or Vss). The multiple transistors (N0, N1, N2, N3, N4, N5) may be activated with the enable signals (sel0, sel1) or the bitline signals provided from the bitlines (rbl0_top, rbl1_top, rbl0_bot, rbl1_bot). In some instances, the enable signals (sel0, sel1) are the complement to the enable signals (sel0b, sel1b).

In some instances, the multiple transistors (N0, N1, N2, N3, N4, N5) may be arranged in a first stack and a second stack that are coupled in parallel between the output node (nand_out) and ground (Gnd or Vss). The first stack may include transistors (NO, N1, N2) coupled in series between the output node (nand_out) and ground (Gnd or Vss), and the second stack may include transistors (N3, N4, N5) coupled in series between the output node (nand_out) and ground (Gnd or Vss). Also, in some instances, the multiple transistors (NO, N1, N2, N3, N4, N5) may include NMOS transistors. However, in other instances, the multiple transistors may include use of PMOS transistors.

In some implementations, as shown in FIG. 2A, the column decoder circuitry 200A has a set of transistors (RP0, SP0, P0) that are arranged and coupled to the output node (nand_out) and a corresponding bitline (rbl0_top). For instance, the read transistor (RP0) may be coupled to the output node (nand_out), the select transistor (SP0) may be coupled between the voltage supply (Vdd) and the read transistor (RP0), and the select activation signal (sel0b) activates a gate of the select transistor (SP0) so as to pass the voltage supply (Vdd) as an output signal (nand_out) to the read transistor (RP0). The bitline (rbl0_top) may be coupled to a gate of the read transistor (RP0), and the bitline (rbl0_top) may provide a bitline signal that activates the gate of the read transistor (RP0) so as to pass the output signal (nand_out) from the select transistor (SP0) to the output node (nand_out). Also, the precharge transistor (P0) may be coupled between the voltage supply (Vdd) and the gate of the read transistor (RP0), and the precharge activation signal (npch_bl_top) activates a gate of the precharge transistor (P0) so as to pass the voltage supply (Vdd) to the gate of the read transistor (RP0). Thus, the voltage supply (Vdd) may be used to precharge the bitline (rbl0_top) at the gate of the read transistor (RP0).

In some implementations, the set of transistors (RP0, SP0, P0) may be a first set of transistors, and the column decoder circuitry 200A may include a second set of transistors (RP1, SP1, P1), a third set of transistors (RP2, SP2, P2), and a fourth set of transistors (RP3, SP3, P3), wherein each set of transistors includes a similar configuration of transistors as the first set of transistors. As such, the column decoder circuitry 200A may be implemented as a system of various circuit components (e.g., various transistors) that are arranged and coupled together as an assemblage or combination of parts that form a column decoding structure, or similar.

FIG. 2B illustrates a diagram of column decoder circuitry 200B in accordance with various implementations described herein. The column decoder circuitry 200B in FIG. 2B has similar circuit components that are similar in scope, operation and function as the column decoder circuitry 200A in FIG. 2A.

As shown in FIG. 2B, the arrangement of circuit components of the column decoder circuitry 200B is similar to the column decoder circuitry 200A in FIG. 2A, except for the swapping of the read transistors (RP0, RP1, RP2, RP3) and the select transistors (SP0 SP1, SP2, SP3). For instance, as shown in FIG. 2B, the read transistors (RP0, RP1, RP2, RP3) and the select transistors (SP0, SP1, SP2, SP3) are coupled in series between the voltage supply (Vdd) and the output node (nand_out). In this instance, the read transistor (RP0) and the select transistor (SP0) are coupled in series between the voltage supply (Vdd) and the output node (nand_out), and the read transistor (RP1) and the select transistor (SP1) are coupled in series between the voltage supply (Vdd) and the output node (nand_out). Also, in this instance, the read transistor (RP2) and the select transistor (SP2) are coupled in series between the voltage supply (Vdd) and the output node (nand_out), and the read transistor (RP3) and the select transistor (SP3) are coupled in series between the voltage supply (Vdd) and the output node (nand_out).

As with the column decoder circuitry 200A of FIG. 2A, the column decoder circuitry 200B of FIG. 2B may also be implemented as a system of circuit components (e.g., various transistors) that are arranged and coupled together as an assemblage or combination of parts that form a column decoding structure, or similar.

Figure 3:
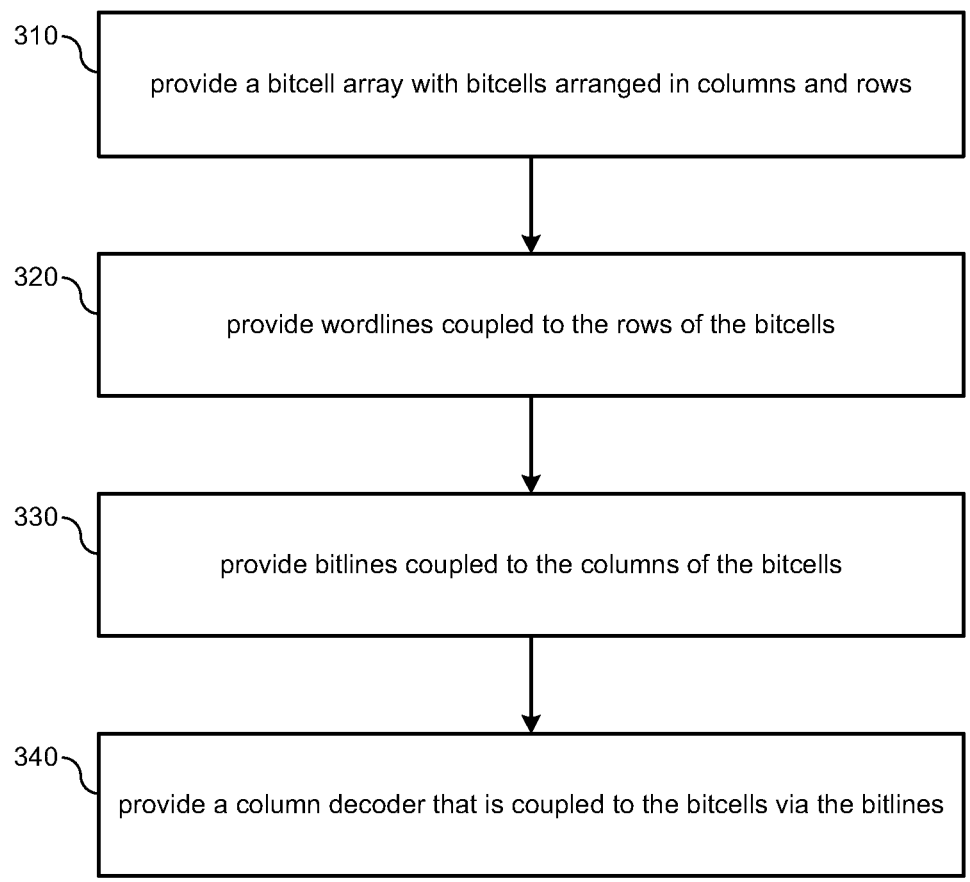
FIG. 3 illustrates a process flow diagram of a method for providing memory circuitry in accordance with various implementations described herein.

FIG. 3 illustrates a process diagram of a method 300 for providing memory circuitry in accordance with various implementations described herein.

It should be understood that even though method 300 indicates a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2B. Also, if implemented in software, method 300 may be implemented as a program and/or software instruction process configured for providing column decoding schemes and techniques, as described herein. Further, if implemented in software, instructions related to implementing the method 300 may be stored in memory and/or a database. For instance, a computer or various other types of computing devices having at least one processor and memory may be configured to perform method 300.

As described and shown in reference to FIG. 3, method 300 may be utilized for fabricating and/or manufacturing, or causing to be fabricated and/or manufactured, an integrated circuit (IC) that implements various column decoding schemes and techniques as described herein that are related to providing column decoding circuitry and/or various associated devices, components and circuits.

At block 310, method 300 may provide a bitcell array with bitcells arranged in columns and rows. At block 320, method 300 may provide wordlines coupled to the rows of the bitcells. At block 330, method 300 may provide bitlines coupled to the columns of the bitcells. Also, at block 340, method 300 may provide a column decoder that is coupled to the bitcells via the bitlines. In some implementations, the column decoder may have read transistors coupled to an output node, and the column decoder may also have select transistors coupled between a voltage supply and the read transistors. Select activation signals may be used to activate gates of the select transistors so as to pass the voltage supply to the read transistors. The bitlines may be coupled to gates of the read transistors, and the bitlines may provide bitline signals to activate the gates of the read transistors so as to pass the voltage supply from the select transistors to the output node.

Described herein are various implementations of an integrated circuit. The integrated circuit may include memory circuitry having an array of bitcells and bitlines coupled to columns of the bitcells. The integrated circuit may include column decoder circuitry coupled to the bitcells via the bitlines. The column decoder circuitry may have read logic coupled to an output node, and the column decoder circuitry may have select logic coupled between a voltage supply and the read logic. In some instances, enable signals may activate the select logic to pass the voltage supply to the read logic, and the bitlines may provide bitline signals that activate the read logic to pass the voltage supply from the select logic to the output node.

Described herein are various implementations of a system having one or more circuit components. The system may include a read transistor coupled to an output node. The system may include a select transistor coupled between a voltage supply and the read transistor. The system may include a select activation signal that activates a gate of the select transistor so as to pass the voltage supply as an output signal to the read transistor. The system may include a bitline coupled to a gate of the read transistor. The bitline may provide a bitline signal that activates the gate of the read transistor so as to pass the output signal from the select transistor to the output node.

Described herein are various implementations of a method. The method may include providing a bitcell array with bitcells arranged in columns and bitlines coupled to the columns of the bitcells. The method may include providing a column decoder coupled to the bitcells via the bitlines, and the column decoder may have read transistors and select transistors coupled between a voltage supply and an output node. The select transistors may pass the voltage supply to the read transistors when activated. The bitlines may be coupled to gates of the read transistors so as to activate the gates of the read transistors and pass the voltage supply from the select transistors to the output node when activated.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
memory circuitry having an array of bitcells and bitlines coupled to columns of the bitcells; and
column decoder circuitry coupled to the bitcells via the bitlines, the column decoder circuitry having read logic coupled to an output node, the column decoder circuitry having select logic coupled between a voltage supply and the read logic,
wherein enable signals activate the select logic to pass the voltage supply to the read logic, and wherein the bitlines provide bitline signals that activate the read logic to pass the voltage supply from the select logic to the output node.

2. The integrated circuit of claim 1, wherein:
the bitlines are read bitlines, and
the bitlines are coupled to the read logic.

3. The integrated circuit of claim 1, wherein:
the select logic comprises select transistors,
the enable signals comprise select activation signals, and
the select activation signals are used to activate gates of the select transistors so as to pass the voltage supply to the read logic.

4. The integrated circuit of claim 1, wherein:
the read logic comprises read transistors,
the bitlines are coupled to gates of the read transistors, and
the bitlines provide the bitline signals to activate gates of the read transistors so as to pass the voltage supply from the select logic to the output node.

5. The integrated circuit of claim 1, further comprising:
precharge logic coupled between the voltage supply and the read logic; and
a precharge activation signal that is used to activate the precharge logic so as to pass the voltage supply to the read logic,
wherein the voltage supply is used to precharge the bitlines with the read logic.

6. The integrated circuit of claim 5, wherein:
the read logic comprises read transistors,
the precharge logic comprises precharge transistors,
the precharge transistors are coupled between the voltage supply and gates of the read transistors,
the precharge activation signal activates gates of the precharge transistors so as to pass the voltage supply to the gates of the read transistors, and
the voltage supply precharges the bitlines at the gates of the read transistors.

7. The integrated circuit of claim 1, further comprising:
output discharge logic coupled to the output node,
wherein the read logic passes the voltage supply to the output node to activate the output discharge logic, and
wherein the output discharge logic passes an output discharge signal to ground.

8. The integrated circuit of claim 7, wherein:
the read logic comprises read transistors,
the output discharge logic comprises an output discharge transistor,
the output node is coupled to a gate of the output discharge transistor,
the read transistors pass the voltage supply to the output node to activate the gate of the output discharge transistor, and
when activated, the output discharge transistor passes the output discharge signal to ground.

9. The integrated circuit of claim 7, wherein the output discharge signal comprises a global data line (GDL) signal.

10. The integrated circuit of claim 1, further comprising:
output circuitry having multiple transistors coupled together in series and arranged in a stack between the output node and ground,
wherein the multiple transistors are activated with the enable signal or the bitline signals.

11. The integrated circuit of claim 1, further comprising:
wordlines coupled to the rows of the bitcells; and
wordline driver circuitry coupled to the bitcells via the wordlines.

12. The integrated circuit of claim 1, wherein:
the memory circuitry comprises multi-port memory,
the bitlines comprise full-swing read bitlines.

13. A system of circuit components, comprising:
a read transistor coupled to an output node;
a select transistor coupled between a voltage supply and the read transistor;
a select activation signal that activates a gate of the select transistor so as to pass the voltage supply as an output signal to the read transistor; and
a bitline coupled to a gate of the read transistor, the bitline providing a bitline signal that activates the gate of the read transistor so as to pass the output signal from the select transistor to the output node.

14. The system of claim 13, further comprising:
a precharge transistor coupled between the voltage supply and the gate of the read transistor; and
a precharge activation signal that activates a gate of the precharge transistor so as to pass the voltage supply to the gate of the read transistor,
wherein the voltage supply precharges the bitline at the gate of the read transistor.

15. The system of claim 13, further comprising:
an output discharge transistor coupled to the output node,
wherein the output node is coupled to a gate of the output discharge transistor,
wherein the read transistor passes the voltage supply to the output node to activate the gate of the output discharge transistor, and
when activated, the output discharge transistor passes an output discharge signal to ground.

16. The system of claim 13, further comprising:
output circuitry having multiple transistors coupled together in series and arranged in a stack between the output node and ground,
wherein the multiple transistors are activated with the select activation signal or the bitline signal.

17. The system of claim 13, wherein the integrated circuit comprises column decoder circuitry as part of multi-port static random access memory (SRAM), and wherein the bitlines comprise full-swing read bitlines.

18. A method, comprising:
providing a bitcell array with bitcells arranged in columns and bitlines coupled to the columns of the bitcells; and
providing a column decoder coupled to the bitcells via the bitlines, the column decoder having read transistors and select transistors coupled between a voltage supply and an output node,
wherein the select transistors pass the voltage supply to the read transistors when activated, and
wherein the bitlines are coupled to gates of the read transistors so as to activate the gates of the read transistors and pass the voltage supply from the select transistors to the output node when activated.

19. The method of claim 18, further comprising:
providing the bitcell array with the bitcells arranged in the columns and rows; and
providing wordlines coupled to the rows of the bitcells.

20. The method of claim 18, wherein the select transistors are coupled between the voltage supply and the read transistors.

21. The method of claim 18, wherein the read transistors are coupled between the select transistors and the output node.

22. The method of claim 18, wherein select activation signals are used to activate gates of the select transistors so as to pass the voltage supply to the read transistors.

23. The method of claim 18, wherein the bitlines provide bitline signals to activate the gates of the read transistors so as to pass the voltage supply from the select transistors to the output node.

* * * * *